(12) United States Patent
Liu et al.

(10) Patent No.: US 7,785,941 B2
(45) Date of Patent: Aug. 31, 2010

(54) METHOD OF FABRICATING THIN FILM TRANSISTOR

(75) Inventors: Sai-Chang Liu, Kaohsiung County (TW); Cheng-Tzu Yang, Hsinchu County (TW); Chien-Wei Wu, Hsinchu County (TW)

(73) Assignees: Taiwan TFT LCD Association, Hsinchu (TW); Chunghwa Picture Tubes, Ltd., Taipei (TW); Au Optronics Corporation, Hsinchu (TW); Hannstar Display Corporation, Tao-Yuan Hsien (TW); Chi Mei Optoelectronics Corporation, Tainan County (TW); Industrial Technology Research Institute, Hsinchu (TW); TPO Display Corp., Miao-Li County (TW)

( * ) Notice: Subject to any disclaimer, the term of this patent is extended or adjusted under 35 U.S.C. 154(b) by 203 days.

(21) Appl. No.: 11/954,082

(22) Filed: Dec. 11, 2007

(65) Prior Publication Data

US 2009/0093093 A1    Apr. 9, 2009

(30) Foreign Application Priority Data

Oct. 4, 2007    (TW) ............................. 96137245 A

(51) Int. Cl.
*H01L 21/00* (2006.01)
*H01L 21/84* (2006.01)
(52) U.S. Cl. .................. 438/151; 438/158; 257/E21.04
(58) Field of Classification Search ................ 438/151, 438/158, 656; 257/E21.04, E21.535, E21.575
See application file for complete search history.

(56) References Cited

U.S. PATENT DOCUMENTS

| 6,727,188 B2 | 4/2004 | Jo et al. |
| 6,780,784 B2 | 8/2004 | Jo et al. |
| 6,881,679 B2 | 4/2005 | Jo et al. |
| 7,008,548 B2 | 3/2006 | Chae et al. |
| 2003/0178656 A1 | 9/2003 | Kwon et al. |
| 2004/0118814 A1 | 6/2004 | Kim et al. |
| 2004/0242000 A1 | 12/2004 | Jo et al. |
| 2004/0262569 A1 | 12/2004 | Cho et al. |
| 2005/0148123 A1 | 7/2005 | Mao-Tsum ............... 438/158 |
| 2006/0281211 A1* | 12/2006 | Yoon et al. ............... 438/34 |

FOREIGN PATENT DOCUMENTS

JP    2002-299630    10/2002

* cited by examiner

*Primary Examiner*—Walter L Lindsay, Jr.
(74) *Attorney, Agent, or Firm*—J.C. Patents

(57) ABSTRACT

A method for fabricating a thin film transistor (TFT) is provided. A substrate having a gate, a dielectric layer, a channel layer and an ohmic contact layer formed thereon is provided. Next, a metal layer is formed over the substrate covering the ohmic contact layer. Next, the metal layer and the ohmic contact layer are simultaneously etched by a wet etching process to form a source/drain and expose the channel layer. Because the wet etching process can be used to selectively etch the ohmic contact layer, damage to the underlying channel layer may be negligible. Thus, the reliability of the device may be promoted. Furthermore, the process may be simplified, the production yield and the throughput of TFT may be increased.

20 Claims, 5 Drawing Sheets

METHOD OF FABRICATING THIN FILM TRANSISTOR

CROSS-REFERENCE TO RELATED APPLICATION

This application claims the priority benefit of Taiwan application serial no. 96137245, filed on Oct. 4, 2007. The entirety of the above-mentioned patent application is hereby incorporated by reference herein and made a part of this specification.

BACKGROUND OF THE INVENTION

1. Field of the Invention

The present invention relates to a simplified process of fabricating thin film transistor (TFT).

2. Description of Related Art

In recent years, with the improvement of the semiconductor fabrication technology, the fabrication process of the thin film transistor (TFT) is being continuously simplified and the fabrication throughput is being increased. TFT is widely used in many fields, such as computer chip, mobile-phone chip and/or thin film transistor liquid crystal displayer (TFT LCD), etc. Taking TFT LCD as an example, the TFT is mainly used to control the loading of data for LCD, which primarily comprises the elements of a gate, a channel layer and source/drain, etc. However, the definitions of the gate, channel layer, source/drain, contact hole, and pixel electrode are commonly accomplished with five masks in the conventional fabrication process of TFT.

FIG. 1A to FIG. 1E are the sectional drawings for a prior method of fabricating TFT. Referring to FIG. 1A, first, a conductive layer (not given in the figure) is formed on the substrate 100; secondly, a photolithography process is performed to pattern the conductive layer for forming a gate 120 by a first mask (not shown).

Next, referring to FIG. 1B, a silicon nitride layer 130 is formed on the substrate 100 to cover the gate 120. Thereafter, an amorphous silicon layer 140 and an n+-type doped amorphous silicon layer 150 are sequentially formed on the silicon nitride layer 130.

Subsequently, referring to FIG. 1C, a photolithography process is performed to pattern the amorphous silicon layer 140 in FIGS. 1B and n+-type doped amorphous silicon layer 150 in FIG. 1B for forming a channel layer 160 and an ohmic contact layer 170 by a second mask (not shown). A metal layer 180 is then formed on the substrate 100.

Next, referring to FIG. 1D, a photolithography process is performed to pattern the metal layer 180 in FIG. 1C for forming a source/drain 190 by a third mask (not shown).

Next, referring to FIG. 1E, a dry etching process 195 is performed on the ohmic contact layer 170 by using the source/drain 190 as a mask, whereby removing the ohmic contact layer 170 on the gate 120 and exposing the channel layer 160.

Because the removing function is obtained by plasma etching via physical bombardment and chemical reaction during the dry etching process 195 as shown in FIG. 1E, the surface of the channel layer 160 will be damaged while the ohmic contact layer 170 is removed, which will lead to producing many dangling bonds so as to effect the electrical performance of the device. An annealing process has to be used again in order to repair the damaged surface.

SUMMARY OF THE INVENTION

Accordingly, the present invention provides a method of fabricating the source/drain of TFT, which may effectively promote the reliability of the devices.

The present invention also provides another method of fabricating TFT with a higher fabrication throughput.

The present invention is directed to a method of fabricating the source/drain of TFT. First, a substrate is provided. Next, a gate, a dielectric layer, a channel layer, and an ohmic contact layer are formed over the substrate. After that, a metal layer is formed over the substrate to cover the ohmic contact layer. Thereafter, the metal layer and the ohmic contact layer are simultaneously etched by a wet etching process to form a source/drain and expose the channel layer.

The present invention is also directed to another method of fabricating TFT. A gate is formed on the substrate, and a dielectric layer is subsequently formed over the gate. After that, a channel layer is formed on the dielectric layer above the gate, and then the ohmic contact layer is formed over the channel layer. Thereafter, the metal layer is formed over the substrate to cover the ohmic contact layer. Subsequently, the metal layer and ohmic contact layer are simultaneously etched by a wet etching process in order to form a source/drain and expose the channel layer.

The present invention provides a wet etching process to selectively etch the ohmic contact layer, which may reduce the problem of causing damage to the underlying channel layer, and thereby increase the reliability of the devices. Moreover, in the present embodiment, because the metal layer and ohmic contact layer are simultaneously etched, the process may be simplified. Hence, the throughput and the yield of the fabrication of the TFT may be increased.

In order to make said characteristic and advantages of the present invention much clear and easy to understand, the preferred embodiments of the present invention will be provided subsequently and the related drawings will be enclosed. The explications are given as the following.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
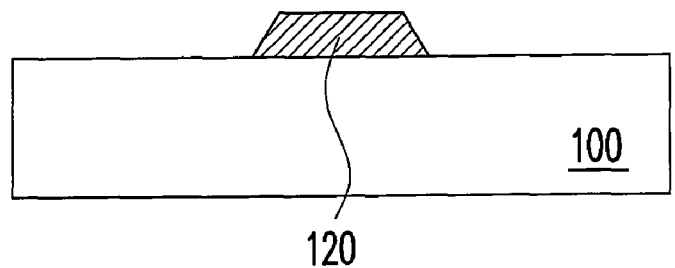
FIG. 1A to FIG. 1E show sectional drawings of a conventional method of fabricating TFT.
Figure 1B:
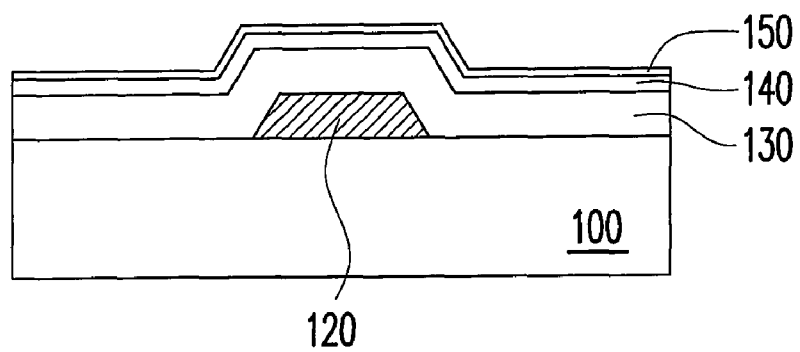
Figure 1C:
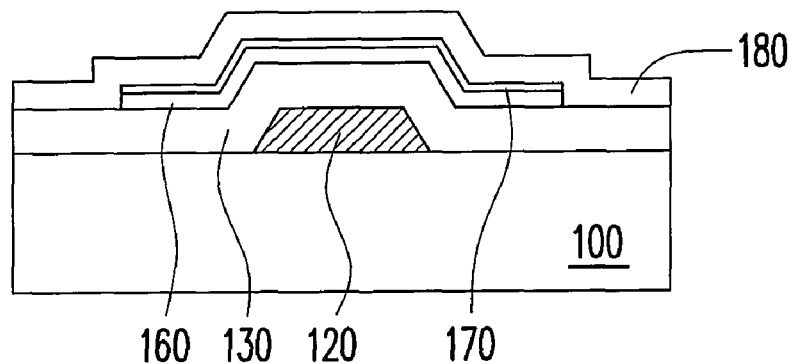
Figure 1D:
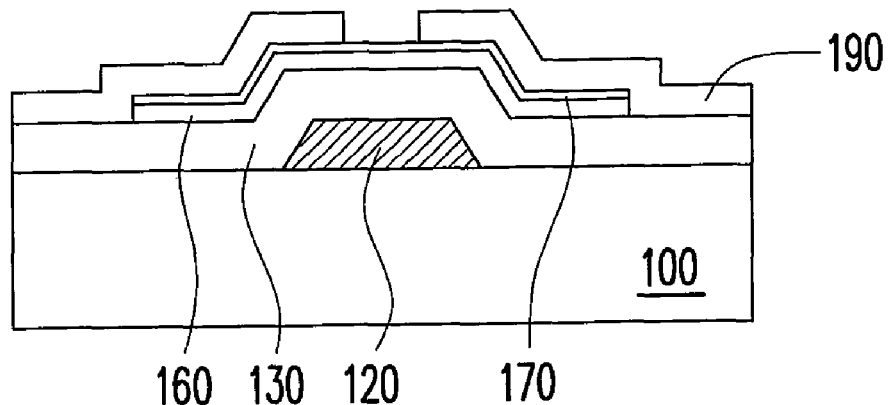
Figure 1E:
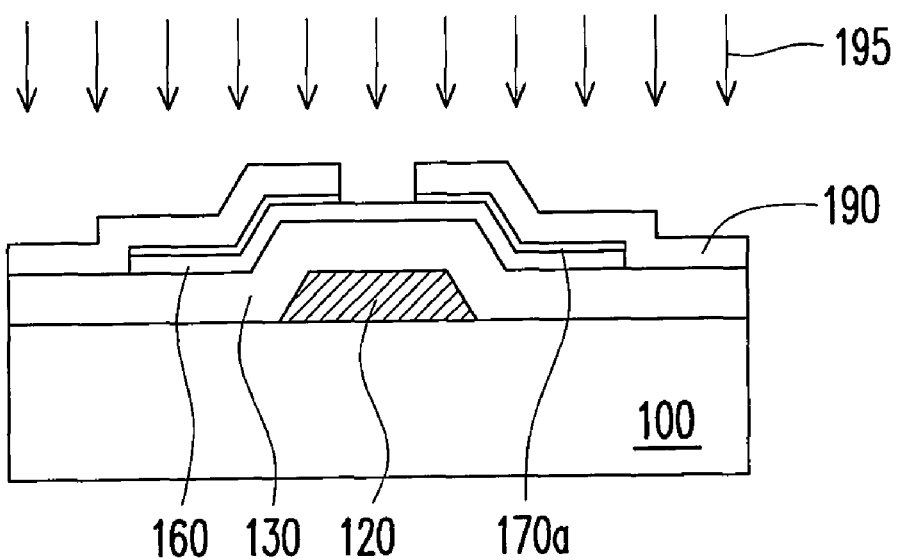

Reference will now be made in detail to the present preferred embodiments of the invention, examples of which are illustrated in the accompanying drawings. Wherever possible, the same reference numbers are used in the drawings and the description to refer to the same or like parts.

Figure 2:
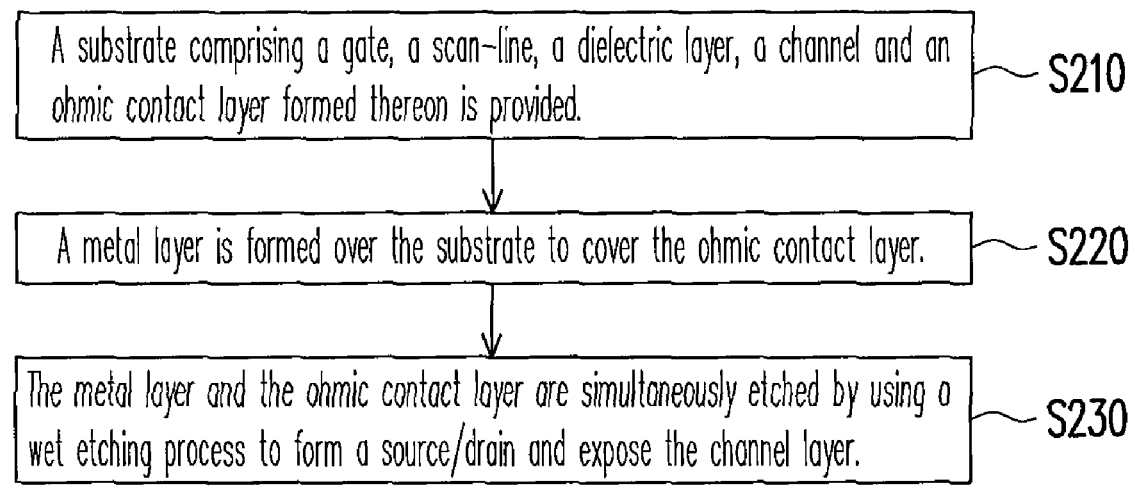
FIG. 2 shows the process flow of fabricating a TFT according to a first embodiment of the present invention.

FIG. 2 shows the process flow of a process of fabricating a TFT according to a first embodiment of the present invention.

Referring to FIG. 2, first, at step S210, a substrate comprising a gate, a scan-line, a dielectric layer, a channel layer and an ohmic contact layer formed thereon is provided. The materials and the process forming the gate, the scan-line, dielectric layer, channel layer and ohmic contact layer may be formed by using well known materials and the process, therefore detail description is omitted herein.

Next, at step S220, a metal layer is formed over the substrate to cover the ohmic contact layer. The metal layer may comprise copper and copper alloy, molybdenum and molybdenum alloy. Examples of copper alloys include magnesium (Mg), chromium (Cr), tungsten (W), molybdenum (Mo), manganese (Mn), zirconium (Zr), titanium (Ti), nitrogen (N), carbon (C) and their mixed alloys; and examples of molybdenum alloys include silver (Ag), tantalum (Ta), titanium (Ti), aluminium (Al), chromium (Cr), nickel (Ni), tungsten (W), gold (Au) and their mixed alloys. The metal layer, for example, comprises a single-layer structure or a multi-layer structure. The multi-layer structure may comprise a double-layer structure and a triple-layer structure. The double-layer structure, for example, can be copper/molybdenum, copper/molybdenum alloy or copper/copper alloy, while the triple-layer structure can be molybdenum/copper/molybdenum, molybdenum alloy/copper/molybdenum alloy or copper alloy/copper/copper alloy.

Next, at step S230, the metal layer and the ohmic contact layer are simultaneously etched by a wet etching process to form a source/drain and expose the channel layer. Along with the formation of the source/drain, a data line is also defined. The etchant used in said wet etching process may be composed of the aqueous solution of hydrogen peroxide, a weak acid matching with hydrogen peroxide and hydrofluoric acid. The hydrogen peroxide is the primary oxidant in the etchant, and the concentration thereof is in a range of 3~30 wt. %. The weak acid matching with hydrogen peroxide, for example, can be phosphoric acid and may be present at a concentration in a range of 0.1~10 wt. %. The concentration of the hydrofluoric acid in the etchant is in a range of 0.05~5 wt. %.

An experimental test is carried out to illustrate the etching rate and the selected etching ratio of the n+-type doped amorphous silicon to amorphous silicon employing the etchant according to the first embodiment is described as follows.

<Experimental Test>

1. First, a substrate of a test chip is taken as a base material of a general TFT. Next, a film layer is formed on the substrate, which may be a n+-type doped amorphous silicon film or an amorphous silicon film.

2. Preparation of the etchant: the etchant can be prepared by homogeneously mixing 8 wt % of hydrogen peroxide, 1 wt % of phosphoric acid and 0.08 wt % of hydrofluoric acid.

3. The above etchant may be used to etch the test chip under 25° C. for 200 seconds.

4. The thickness differences of the test chip before and after etching are compared to calculate the etching rates for the individual films etched by the etching liquid.

<Experimental Test Result>

Table 1 illustrates the etching rate of the n+-type doped amorphous silicon and that the selected etching ratio of the n+-type doped amorphous silicon to amorphous silicon etched using the etchant of the first embodiment.

TABLE 1

| Species of Films | Etching Rate (Å/Sec.) | The Selected Etching Rate Ratio of the n+-type doped amorphous silicon to amorphous silicon |
| --- | --- | --- |
| n+-type doped amorphous silicon | 2 | 2.9 |
| amorphous silicon | 0.7 | |

As can be obviously seen from Table 1 that, the etching rate of the amorphous silicon is low compared to that of n+-type doped amorphous silicon, providing proper material selection for forming the ohmic contact layer and the channel layer and employing the etchant described above. More specifically, it would be advantageous to select the n+-type doped amorphous silicon material to form the ohmic contact layer and select the amorphous silicon material to form the channel layer so that the etchant may selectively etch the ohmic contact layer and cause minimal damage to the underlying channel layer. Consequently, the reliability of the devices can be effectively promoted.

FIG. 3A to FIG. 3D are sectional views illustrating the fabrication process of a TFT according to a second embodiment of the present invention.

Figure 3A:
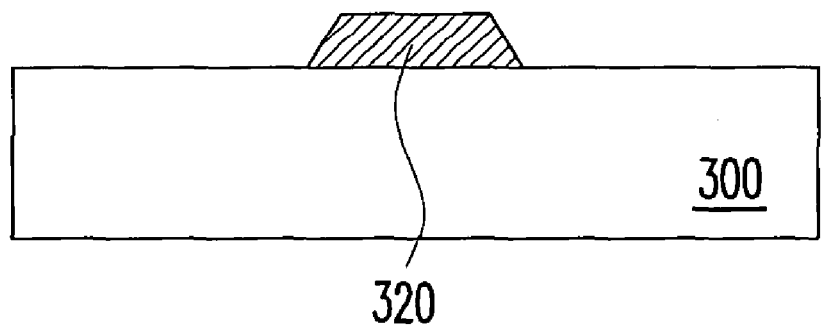
FIG. 3A to FIG. 3D are sectional views illustrating the fabrication process of a TFT according to a second embodiment of the present invention.

Referring to FIG. 3A, first, a substrate 300 comprising a gate 320 and a scan-line (not shown in the drawing) formed thereon is provided. The substrate 300 may be comprised of, for example, either silicon or glass base material. The gate 320 and the scan-line may be comprised of, for example, chromium (Cr), molybdenum (Mo), or other conductive material. The step of forming the gate 320 and the scan-line includes, for example, forming a conductive layer (not given in the figure) on the substrate 300 and patterning the conductive layer by performing a first mask (not shown) and a photolithography process.

Figure 3B:
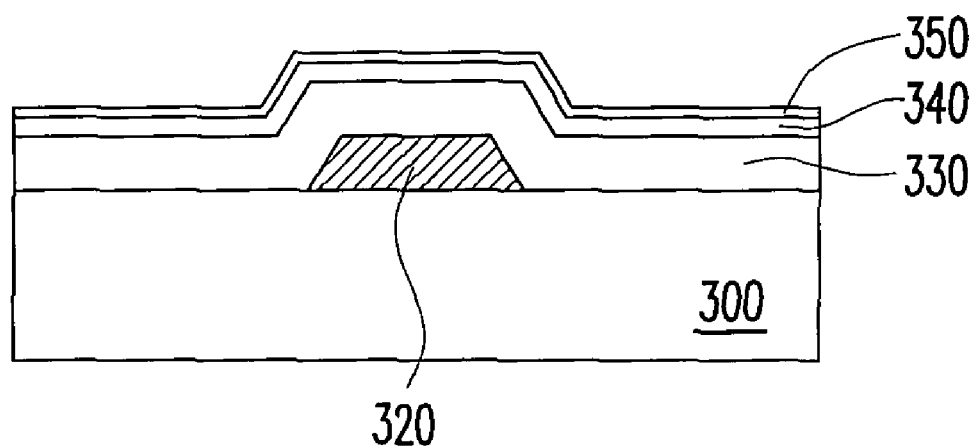

Next, referring to FIG. 3B, a dielectric layer 330 is formed over the gate 320. The dielectric layer 330 comprises, for example, silicon oxide or silicon nitride, and may be formed by, for example, performing a chemical vapor deposition process. Next, the channel layer 340 and ohmic contact layer 350 are sequentially formed on the dielectric layer 330. The channel layer 340 comprises, for example, amorphous silicon, and may be formed via chemical vapor deposition process. The ohmic contact layer 350 comprises, for example, n+-type doped amorphous silicon, and may be formed via chemical vapor deposition and n+-type type ions may in situ doped into it.

Figure 3C:
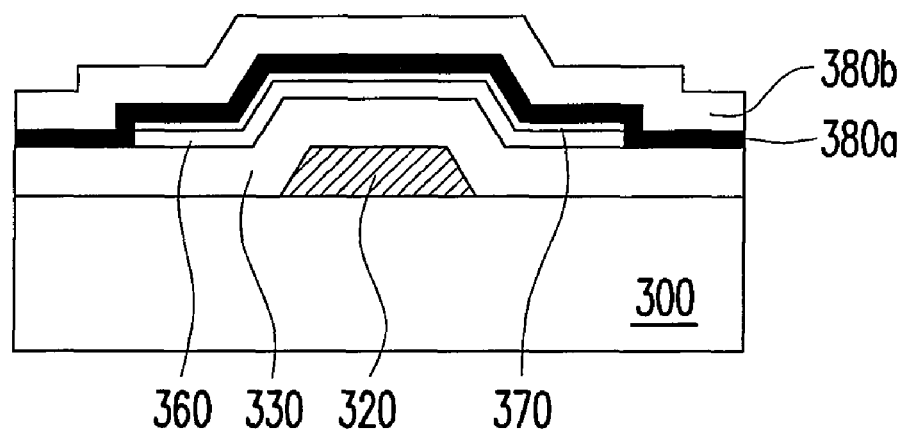

Thereafter, referring to FIG. 3C, the channel layer 340 and ohmic contact layer 350 shown in FIG. 3B are patterned by performing a second mask (not shown) and a photolithography process. The etching process may include, for example, a dry etching process. Next, the metal layers 380a and 380b are formed over the substrate 300. In the present embodiment, the metal layers 380a and 380b may be taken as a double-layer structure. In other embodiments, the metal layers 380a and 380b may be taken as a single metal layer or triple-layer structure. The metal layers 380a and 380b may be fabricated by performing, for example, a sputtering process.

Figure 3D:
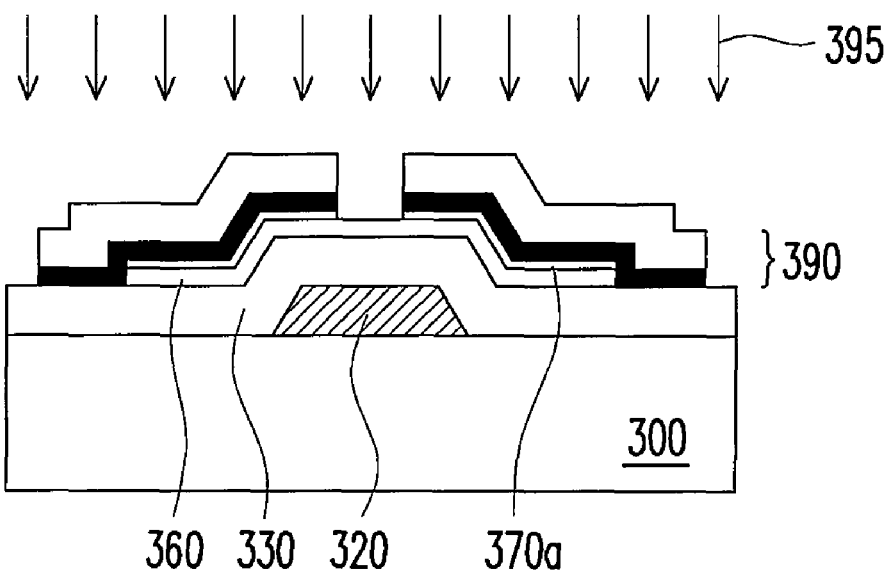

Next, referring to FIG. 3C and FIG. 3D, the metal layer 380a and 380b, and the ohmic contact layer 370 are simultaneously etched by using a wet etching process 395 in to form a source/drain 390 and a data-line (not shown). Because the ohmic contact layer 370 is removed, the underlying channel layer 360 may be exposed. The etchant used in the wet etching process 395 may be composed of an aqueous solution of hydrogen peroxide, a proper weak acid matching with hydrogen peroxide and hydrofluoric acid. The hydrogen peroxide is the primary oxidant in the etchant, and present at a concentration in a range of 3~30 wt. %. The weak acid matching with hydrogen peroxide includes, for example, phosphoric acid, and is present at a concentration in a range of 0.1~10 wt. %. The concentration of the hydrofluoric acid is in a range of 0.05~5 wt. %. In addition, prior to carrying out the wet etching process, for example, a cover layer (not shown) is formed over the metal layer 380b and a third mask (not shown) and photolithography process may be carried to pattern the metal layer 380b.

In summary, the metal layer and the ohmic contact layer are simultaneously etched by a wet etching process to form a source/drain and expose the channel layer. According to the present invention, because the etching rate of the channel layer beneath the ohmic contact layer is much lower than that of the ohmic contact layer, and therefore the surface of the channel layer may not get damaged. Thus, the reliability of the devices may be effectively promoted. In addition, because the metal layer and the ohmic contact layer are simultaneously etched, the process may be simplified. Hence, the throughput of the fabrication process may be increased and the efficiency of the fabrication process may be effectively promoted.

Although the preferred embodiment has been discovered as the above in the present invention, it does not be used to limit the present invention. Anyone who has the general knowledge in the relevant field can make some modification and/or retouching without departing from the scope or spirit of the invention. In view of the foregoing, it is intended that the present invention cover modifications and variations of this invention provided they fall within the scope of the following claims and their equivalents. Thus the protecting coverage of the present invention follows the definition of the application declaration enclosed in the present invention.

What is claimed is:

1. A method for fabricating a source/drain of a thin film transistor (TFT), comprising:
   providing a substrate comprising a gate, a dielectric layer, a channel layer and an ohmic contact layer formed thereon;
   forming a metal layer over the substrate to cover the ohmic contact layer; and
   etching the metal layer and the ohmic contact layer simultaneously by using a wet etching process to form a source/drain and expose the channel layer, wherein an etchant used in said wet etching process comprises an aqueous solution of mixture of hydrogen peroxide, phosphoric acid and hydrofluoric acid.

2. The method as claimed in claim 1, wherein a concentration of hydrogen peroxide in said etchant is in a range of 3~30 wt. %.

3. The method as claimed in claim 1, wherein a concentration of phosphoric acid in said etchant is in a range of 0.1~10 wt. %.

4. The method as claimed in claim 1, wherein a concentration of hydrofluoric acid in said etchant is in a range of 0.05~5 wt. %.

5. The method as claimed in claim 1, wherein the metal layer comprises copper, copper alloy, molybdenum and molybdenum alloy.

6. The method as claimed in claim 5, wherein said copper alloy comprises magnesium (Mg), chromium (Cr), tungsten (W), molybdenum (Mo), manganese (Mn), zirconium (Zr), titanium (Ti), nitrogen (N), carbon (C) and their mixed alloys; and said molybdenum alloys comprise silver (Ag), tantalum (Ta), titanium (Ti), aluminium (Al), chromium (Cr), nickel (Ni), tungsten (W), gold (Au) and their mixed alloys.

7. The method as claimed in claim 5, wherein the step forming said metal layer comprises a step of forming a single material layer and a multi-layer structure.

8. The method as claimed in claim 7, wherein said multi-layer structures comprise a double-layer structure and a triple-layer structure.

9. The method as claimed in claim 8, wherein said double-layer structure is selected from a group consisting of copper/molybdenum, copper/molybdenum alloy and copper/copper alloy.

10. The method as claimed in claim 8, wherein said triple-layer structure is selected from a group consisting of molybdenum/copper/molybdenum, molybdenum alloy/copper/molybdenum alloy and copper alloy/copper/copper alloy.

11. A method for fabricating a thin film transistor (TFT), comprising:
    providing a substrate;
    forming a gate over the substrate;
    forming a dielectric layer over the gate;
    forming a channel layer over the dielectric layer;
    forming an ohmic contact layer over the channel layer;
    forming a metal layer over the substrate and covering the ohmic contact layer; and
    etching the metal layer and the ohmic contact layer simultaneously using a wet etching process to form a source/drain and expose the channel layer, wherein an etchant used in said wet etching process comprises an aqueous solution of hydrogen peroxide, phosphoric acid and hydrofluoric acid.

12. The method for fabricating a thin film transistor (TFT) as claimed in claim 11, wherein a concentration of hydrogen peroxide in said etchant is in a range of 3~30 wt. %.

13. The method for fabricating a thin film transistor (TFT) as claimed in claim 11, wherein a concentration of phosphoric acid in said etchant is in a range of 0.1~10 wt. %.

14. The method for fabricating a thin film transistor (TFT) as claimed in claim 11, wherein a concentration of hydrofluoric acid in said etchant is in a range of 0.05~5 wt. %.

15. The method for fabricating a thin film transistor (TFT) as claimed in claim 11, wherein the metal layer comprises copper, copper alloy, molybdenum and molybdenum alloy.

16. The method for fabricating a thin film transistor (TFT) as claimed in claim 15, wherein said copper alloy comprises magnesium (Mg), chromium (Cr), tungsten (W), molybdenum (Mo), manganese (Mn), zirconium (Zr), titanium (Ti), nitrogen (N), carbon (C) and their mixed alloys; and said molybdenum alloys comprise silver (Ag), tantalum (Ta), titanium (Ti), aluminium (Al), chromium (Cr), nickel (Ni), tungsten (W), gold (Au) and their mixed alloys.

17. The method for fabricating a thin film transistor (TFT) as claimed in claim 15, wherein the step of forming said metal layer comprises a step of forming a single material layer and a multi-layer structure.

18. The method for fabricating a thin film transistor (TFT) as claimed in claim 17, wherein said multi-layer structure comprises a double-layer structure and a triple-layer structure.

19. The method for fabricating a thin film transistor (TFT) as claimed in claim 18, wherein said double-layer structure is selected from a group consisting of copper/molybdenum, copper/molybdenum alloy and copper/copper alloy.

20. The method for fabricating a thin film transistor (TFT) as claimed in claim 18, wherein said triple-layer structure is selected from a group consisting of molybdenum/copper/molybdenum, molybdenum alloy/copper/molybdenum alloy and copper alloy/copper/copper alloy.

* * * * *